(12) United States Patent
Kim

(10) Patent No.: US 7,339,651 B2
(45) Date of Patent: Mar. 4, 2008

(54) EXPOSURE EQUIPMENT AND RELATED CONTROL METHOD

(75) Inventor: Soo-Han Kim, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 214 days.

(21) Appl. No.: 11/213,849

(22) Filed: Aug. 30, 2005

(65) Prior Publication Data
US 2006/0072086 A1  Apr. 6, 2006

(30) Foreign Application Priority Data
Oct. 6, 2004  (KR) ............... 10-2004-0079696

(51) Int. Cl.
G03B 27/42 (2006.01)
G03B 27/32 (2006.01)
G01B 11/00 (2006.01)

(52) U.S. Cl. .................. 355/53; 355/77; 356/394

(58) Field of Classification Search ............. 355/53, 355/67, 77; 356/390, 392, 399, 400, 401, 356/635, 394; 382/144, 145
See application file for complete search history.

(56) References Cited

U.S. PATENT DOCUMENTS 5,677,091 A * 10/1997 Barr et al. ................ 430/5
6,064,484 A *  5/2000 Kobayashi et al. ....... 356/390
6,486,939 B2 * 11/2002 Lin ........................... 355/53

FOREIGN PATENT DOCUMENTS

| JP | 09-304032 | 11/1997 |
| KR | 1998-026695 | 7/1998 |
| KR | 1020020057539 A | 7/2002 |

* cited by examiner

Primary Examiner—Alan Mathews
(74) Attorney, Agent, or Firm—Volentine & Whitt, PLLC

(57) ABSTRACT

Exposure equipment adapted for use in the manufacture of semiconductor devices and a related control are disclosed. A wafer stage in the exposure equipment comprises an image sensor adapted to detect patterned light from the reticle. Image data corresponding to the detected patterned light is compared to reference image data to verify a state of overlay mismatch of reticle pattern accuracy prior to wafer exposure.

17 Claims, 6 Drawing Sheets

EXPOSURE EQUIPMENT AND RELATED CONTROL METHOD

BACKGROUND OF INVENTION

1. Technical Field

The present invention relates generally to exposure equipment and related control methods useful in the manufacture of semiconductor devices. More particularly, the invention relates to exposure equipment and related control methods adapted to detect an image pattern on a reticle and verify its overlay or accuracy.

This application claims the benefit of Korean Patent Application No. 2004-79696, filed Oct. 6, 2004, the disclosure of which is hereby incorporated by reference in its entirety.

2. Discussion of the Related Art

The manufacture of semiconductor devices is a long and complicated process. It generally starts with the fabrication of defect-free silicon wafer. Before actually forming circuits and elements on the wafer it must be carefully machined, polished and cleaned. Thereafter, a multiplicity of specific processes are sequentially applied to the wafer in order to form the multi-layer circuits and elements that constitute a contemporary semiconductor device. Such processes are conventional in nature and well understood. They include, as ready examples, processes related to photolithography, etching, thin film deposition, diffusion, etc.

Photolithography is a well known process that comes in a variety of types and capabilities. Generally speaking, however, a photolithography process transfers geometric shapes defined by a mask onto the surface of the silicon wafer being processed. The steps typically involved in a photolithographic process include; wafer cleaning, barrier layer formation, photoresist application, soft baking, mask alignment, exposure and development, and hard baking.

Photolithography exposure is a process of transferring a circuit pattern formed on a reticle onto the surface of a wafer, wherein the wafer has a photosensitive film applied thereon. The circuit pattern is transferred through an optical system which optically reduces it during transfer. The photolithography exposure process is typically implemented using exposure equipment, such as a scanner or stepper.

The minutely detailed patterns that define the circuits of a semiconductor device are contained in one or more reticles carefully positioned within the exposure equipment. Highly accurate positioning of the reticle within the exposure equipment is required in order to accurately "transfer" the circuit patterns.

A typical reticle is formed from chrome on a quartz substrate. Reticles correspond one-for-one with particular circuits or circuit portions to be transferred onto a wafer.

Contemporary semiconductor devices generally include a number of layers stacked vertically one on top of the other. Since each layer contains minutely detailed circuitry, many reticles must be used in some coherent combination to properly manufacture a single semiconductor device. Since the minutely detailed circuitry must often be connected upwards or downward with circuitry formed on an adjacent layer, the various reticles must accurately "match-up," not only laterally within a single layer, but also vertically between layers. This accuracy of inter-reticle match-up (i.e., the state of overlay matching) is a common consideration referred to as "overlay."

Careful examination and verification of overlay is essential. The issue of overlay accuracy has become all the more important as integration densities for contemporary semiconductor devices have increased.

Conventionally, overlay accuracy was verified by an operator directly examining the respective reticles using an electron microscope or similar device. Overlay marks formed on respective reticles are used to aid this manually performed, visual verification process.

Unfortunately, mechanical vibrations and other factors integral to the operation of exposure equipment generally result in some overlay matching error. Defects in one or more reticles result in additional overlay matching error. Nonetheless, up to the present, no exposure equipment exists which is capable of automatically examining overlay for an entire circuitry pattern formed by the use of multiple reticles.

As a result, equipment operators are forced to rely on overlay marks as rough guides to determining overlay accuracy. This approach yields, at best, an indirectly estimate of overlay accuracy.

Additionally, conventional exposure equipment really doesn't have the ability to examine an entire circuit pattern formed from multiple reticles. This inability greatly limits the ability of equipment operators to verify reticle matching and overall circuit transfer accuracy.

SUMMARY OF THE INVENTION

Embodiments of the present invention provide exposure equipment adapted to the manufacture of semiconductor devices in which an image sensor is installed on a wafer stage. The image sensor is adapted to detect patterned light from a reticle in order to determine, for example, a state of overlay mismatch between the reticle and a previously exposed reticle, or to verify the accuracy of the reticle pattern against a design reference.

Embodiments of the invention also provide a control method of for the exposure equipment, such that pattern accuracy or overlay may be verified before a wafer is exposed.

For example, exposure equipment useful in the manufacture of semiconductor devices may comprise; a wafer stage adapted to seat a wafer, a light system adapted to provide light having a desired wavelength, a reticle adapted to pass the light received from the light system and generate patterned light, an optical system positioned between the wafer stage and the reticle and adapted to direct the patterned light, an image sensor adapted to detect the patterned light and generate image data corresponding to the patterned light, and a comparing section adapted to compare the image data with stored reference image data.

Embodiments of the exposure equipment may include a wafer stage comprising a holding region adapted to seat the wafer and a detecting region adapted to receive the image sensor, and/or a wafer stage transfer unit adapted to move the wafer stage so as to selectively expose the holding region and the detecting region to the patterned light provided by the optical system or light from the light system.

Embodiments of the exposure equipment may also include a storage device associated with the comparing section and adapted to store image data and reference image data, and/or a control section adapted to control transfer of image data between the storage device and the comparing section.

The reference image data may comprise image data related to a previously exposed reticle or image data related to a design reference. Within this context, the comparison of the image data and reference image data may indicate a state of overlay mismatch between two or more reticles.

In another embodiment, the invention provides a method of controlling exposure equipment during the manufacture of a semiconductor device. The method may comprise emitting light having a desired wavelength and passing the light through a reticle and an optical system to expose either a wafer seated on a wafer stage or an image sensor to patterned light generated by the reticle, detecting the pattern light with the image sensor; and comparing image data generated by the image sensor in response to the detected pattern light with reference image data stored in a storage device.

Here again, the reference image data may comprise image data related to a previously exposed reticle or image data related to a design reference. Again within this context, upon determining that the compared image data and reference image data are substantially similar, exposing the wafer to the pattern light, or upon determining that the compared image data and reference image data are not substantially similar, entering an interlock condition.

The comparison of the image data and reference image data may indicate a state of overlay mismatch between the reticle and the previously exposed reticle, or verify the accuracy of a pattern formed on the reticle in relation to a design reference associated with the pattern.

BRIEF DESCRIPTION OF THE DRAWINGS

The invention, along with several its associated advantages and benefits, will become more apparent upon consideration of one or more embodiments described below. In the drawings, like reference numbers refer to like or similar elements. In the attached drawings.

DESCRIPTION OF EXEMPLARY EMBODIMENTS

Figure 1:
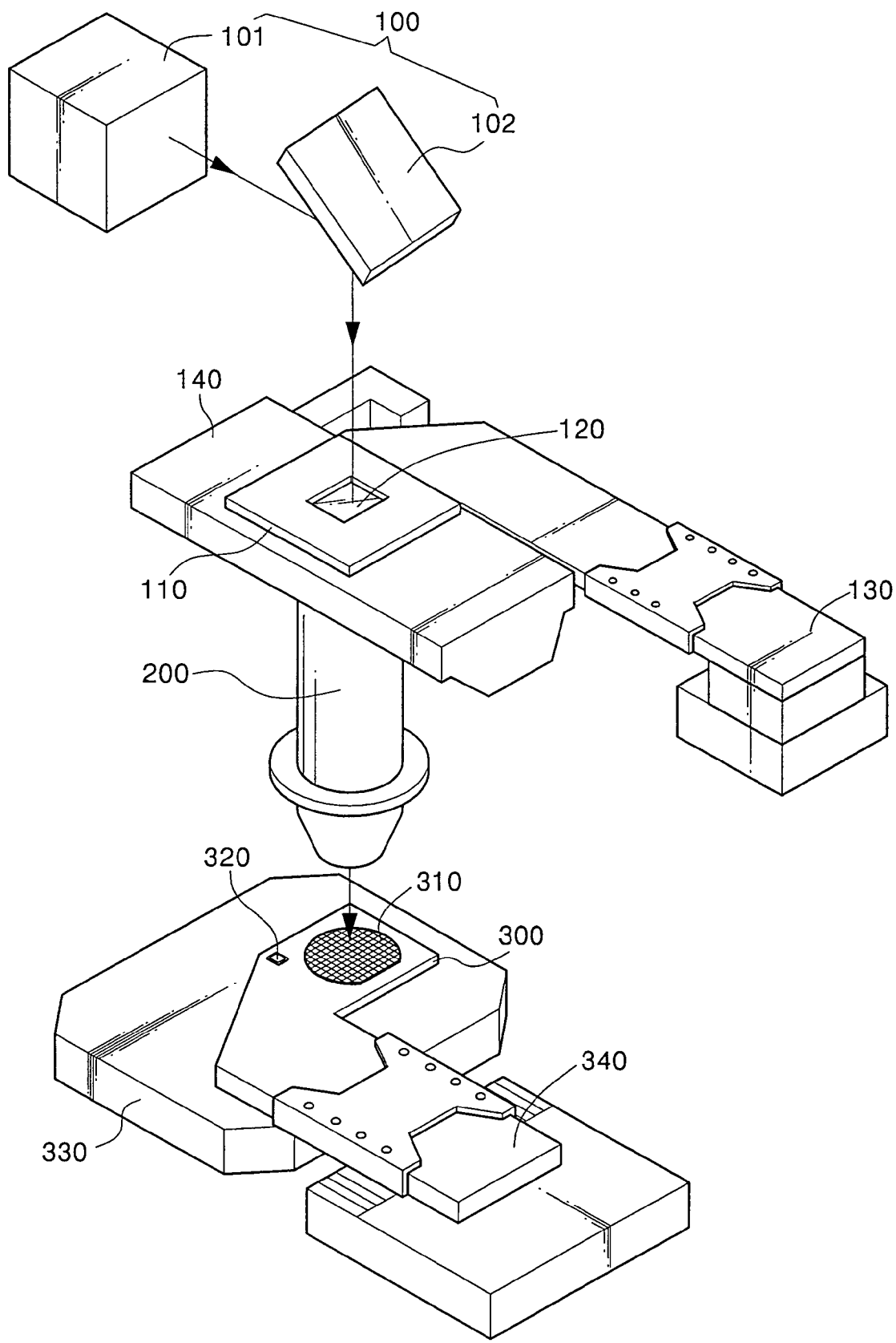
FIG. 1 is a perspective view illustrating a construction of an exposure equipment according to the present invention.

Embodiments of exposure equipment adapted to the manufacture of semiconductor devices are described hereafter within the context of the invention. A related method of controlling the exposure equipment is also described. Throughout these descriptions reference is made to the accompanying drawings.

The embodiments that follow are presented as teaching examples. Those of ordinary skill in the art will understand, however, that the invention may be embodied in many different forms and variations, and the scope of the invention should not be construed as limited to only the teaching embodiments.

FIG. (FIG.) 1. illustrates one embodiment of exposure equipment adapted for use in the manufacture of semiconductor devices according to the invention. It generally includes a wafer stage 300, a light system 100, a reticle stage 110 positioned between wafer stage 300 and light system 100, and an optical system 200 positioned between wafer stage 300 and reticle stage 110.

A reticle 120 is safely seated on reticle stage 110. Light from light system 100 is directed through reticle 120 and optical stage 200 onto a target portion of wafer 310 seated in wafer stage 300. As the light passes through reticle 120 it forms patterned light. This patterned light is focused or directed to a target portion of wafer 310.

Figure 2:
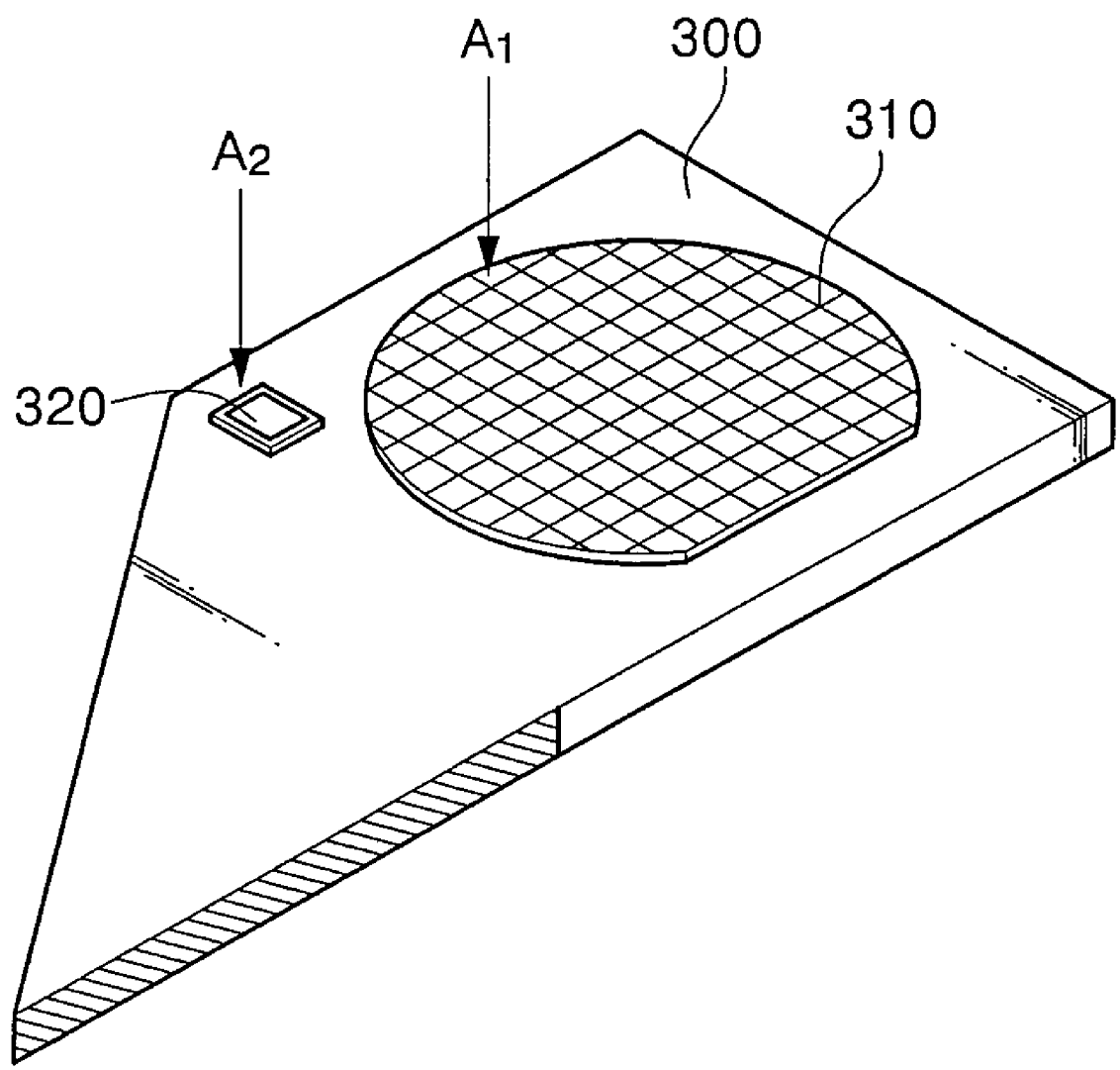
FIG. 2 is an enlarged perspective view of a wafer stage of an exposure equipment of the present invention where an image sensor is installed.

The exemplary arrangement will now be described in some additional detail with reference to FIGS. 1, 2 and 3.

Wafer stage 300 is positioned on a support 330 and holds wafer 310 in place. More specifically, wafer stage 300 includes a wafer holding region A1 adapted to holding wafer 310 using, for example, a vacuum suction mechanism, and a detecting region A2 comprising a detection device, such as, for example, an image sensor 320. As illustrated, detecting region A2 is placed adjacent to holding region A1. However, it may be otherwise located.

Image sensor 320 is a device adapted to convert optical information, detected in one or more dimensions, into a corresponding electrical signal. Image sensor 320 may be formed from a Charge Coupled Device (CCD) type sensor, and/or a Complementary Metal Oxide Semiconductor (CMOS) type sensor, for example.

In the illustrated embodiment, a CMOS image sensor is employed. As compared with a CCD image sensor, the CMOS image sensor has at least one notable advantage; namely, the analog and digital circuits used to realize the CMOS image sensor may be directly implemented on a single integrated circuit.

Many commercially available CMOS image sensors effectively convert optical image data into a corresponding electrical signal, and may be manufactured using conventional CMOS technology. Contemporary CMOS image sensors are formed by an arrangement of MOS transistor-based imaging elements corresponding to a desired number of image pixels. For example, each imaging element may be formed from a photo diode and a switching node adapted to convert detected optical image data into corresponding digital signals (voltages or currents) using the associated MOS transistors.

Conventional CMOS image sensors not only include such cheap and reliable circuitry but are also easily adapted to various scanning modes. The number and type of scanning modes compares very favorably with conventional CCD image sensors. Accordingly, embodiments of the invention advantageously implementing scanning type exposure equipment may preferably use the CMOS image sensor.

Wafer stage 300 is supported at its lower portion by a linear guide (not shown) and may be adjustably positioned in the x-axis and Y-axis directions (e.g., bi-directional) relative to support 330. To one side, wafer stage 300 further comprises a wafer stage transfer unit 340. Wafer stage transfer unit 340 is installed so as to allow wafer stage 300 to be bi-dimensionally moved during an exposure process, such that substantially the entire surface of wafer 310 and the image sensor 320 may be irradiated with light from optical system 200. Various kinds of linear motors may be used to mechanically drive wafer stage transfer unit 340.

Light system 100 functions to project light having a desired wavelength over the surface of wafer 310. Light system 100 generally comprises a light source 101 and one or more reflecting mirror(s) 102.

Light source 101 may comprise, for example, a KrF excimer laser emitting light at a 248 nm wavelength, or an ArF excimer laser emitting light at a 193 nm wavelength.

Reticle stage 110 is positioned between light system 100 and wafer stage 300 such that light emitted from light system 100 is directed toward wafer 310 through reticle 120 and optical system 200. Reticle 120 contains a circuit pattern and is loaded into reticle stage 110 above wafer 310.

Reticle 120 may be loaded to reticle stage 110 using conventional robotic equipment adapted to transfer a reticle selected from a plurality of reticles from storage to reticle stage 110. Reticle transfer from storage to stage may additionally make a stop at a conventional detection device adapted to inspect the selected reticle for foreign substances.

Reticle stage 110 is supported by a support 140 installed with a linear guide that allows linear movement of reticle stage 110.

Reticle stage 110 is also connected at one end to reticle stage transfer unit 130 adapted to positionally adjust reticle stage 110 during a staging and/or calibration processes applied to reticle stage 110. Reticle stage transfer unit 130 may also variously employ many kinds of conventionally available linear motors like the one used in wafer stage transfer unit 340.

Optical system 200 functions to project the light patterned by reticle 120 onto a target portion of wafer 310. Optical system 200 is conventionally formed with a lens barrel shaped like a hollow cylinder and a plurality of lenses installed therein. Optical system 200 may also include a stepper lens, if required, to implement a stepper projection exposure using reticle 120.

Figure 3:
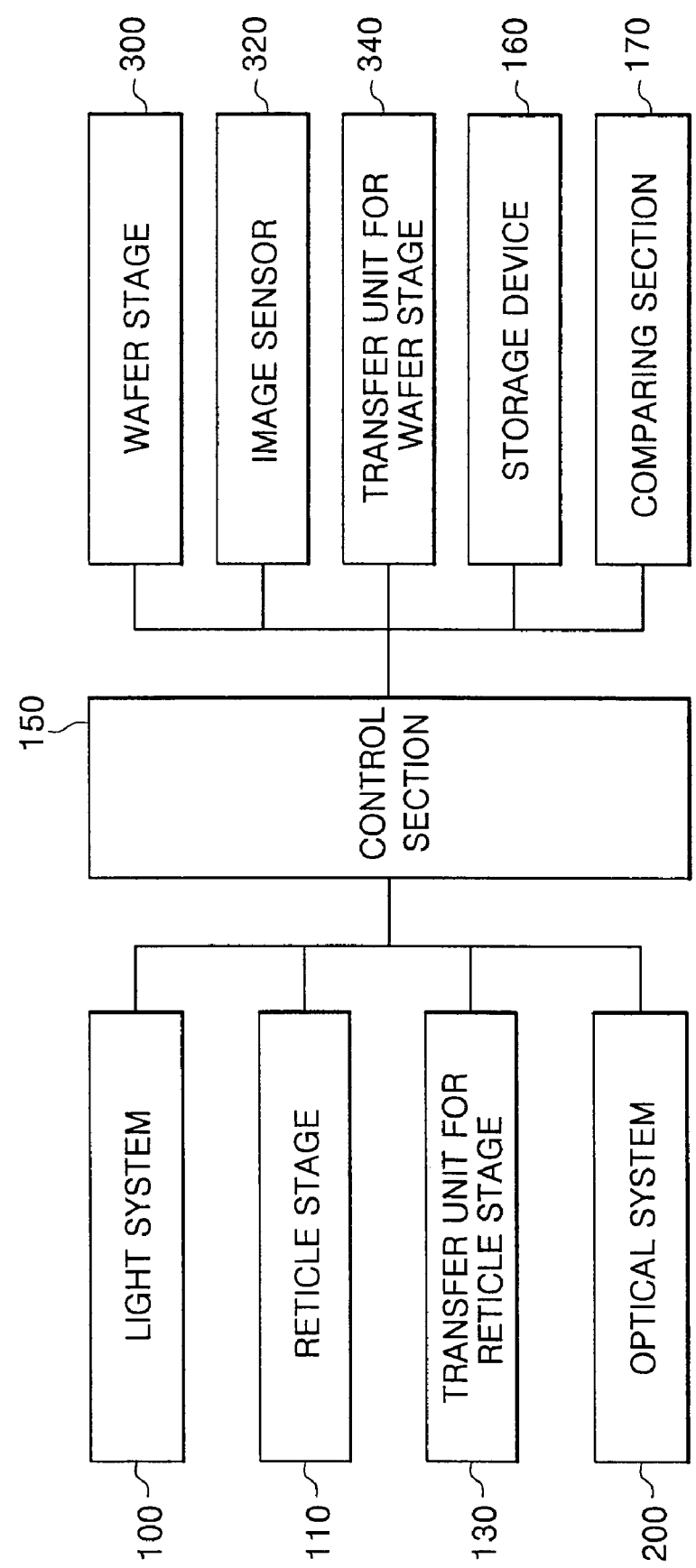
FIG. 3 is a constructional block diagram of an exposure equipment of the present invention.

A number of the foregoing elements and associated control elements are shown in FIG. 3. A control section 150 generally controls these elements within a defined control process. Storage device 160 is a memory of conventional sorts adapted to store image data output from image sensor 320 and further adapted to operate in response to control section 150. Storage device 160 may be formed from a memory chip or a hard disk, for example.

The exemplary exposure equipment further comprises a comparing section 170 adapted to compare image data and further adapted to receive image data from storage device 160. Comparing section 170 functions to compare, for example, digital signals corresponding to two different sets of image data. That is, comparing section 170 may be formed from a conventional digital data comparator adapted to determine whether respective digital signals corresponding to the same portion of the two images are identical to one another.

An exemplary control method adapted for use within exposure equipment like that described above will be described with reference to FIGS. 1, 2, and 3.

The control begins with an assumption that wafer 310 has been placed on wafer stage 300, reticle 120 has been loaded on reticle stage 110, and light system 100 is operating properly to direct light of a desired wavelength onto a target portion of wafer 310. The emitted light reaches the target portion on wafer 310 via reticle 120 seated on reticle stage 110 and via optical system 200 provided under reticle 120.

Wafer stage transfer unit 340 then moves wafer stage 300 in such a manner that additional target portions of wafer 310 are exposed to the directed light until the entire surface of wafer 310 is substantially exposed.

Prior to exposing wafer 310 in this manner, the exemplary exposure equipment may first examine the pattern on reticle 120, and/or verify the state of overlay matching between the pattern on reticle 120 and a previously selected reticle (e.g., a reticle containing a circuit pattern underlying the circuit pattern on reticle 120). Overlay matching as implemented through pattern examination may be accomplished by comparing image data detected by image sensor 320 during an exposure process associated with the previously selected reticle.

Figure 4:
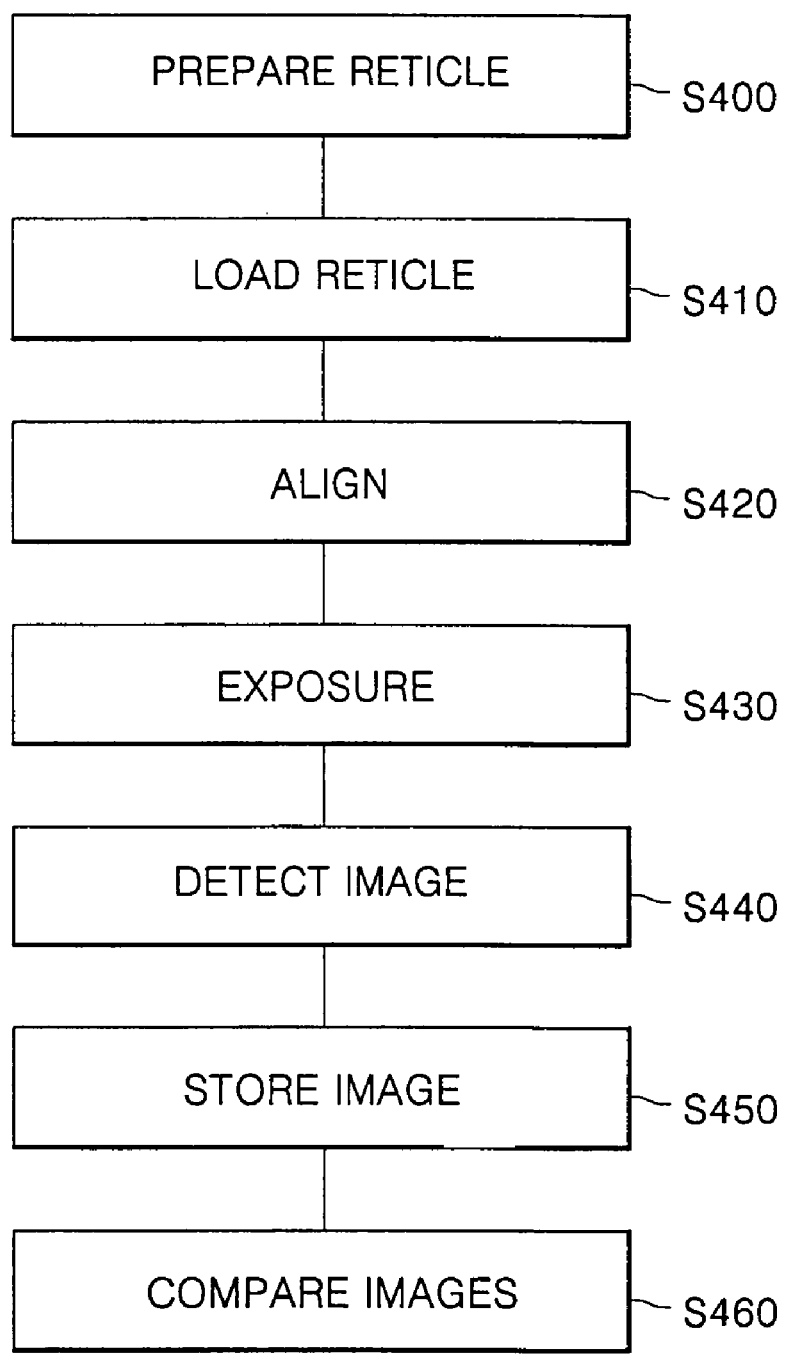
FIG. 4 is a flow chart illustrating an image detecting operation of a reticle in an exposure equipment of the present invention.

This process will now be described in some additional detail with reference to FIG. 4 in conjunction with the foregoing Figures. Before being used in an exposure process, reticle 120 must first be prepared with a desired circuit image (S400). This preparation of reticle 120 is typically conducted by first designing the pattern with the aid of a CAD design tool. The resulting pattern design is then plated in chrome on a quartz plate. Of course, a verification of the pattern design is typically made by detailed examination of the reticle 120 before it use.

Once reticle 120 has been prepared, it is stored until needed in a reticle storage bin (not shown). When ultimately needed, reticle 120 is retrieved from the reticle storage bin by a transfer robot (not shown), and placed (i.e., "loaded") on reticle stage 110 (S410). Then, wafer stage 300 is moved into place and aligned such that the pattern image transferred by reticle 120 may be detected by image sensor 320 (S420).

With the prepared reticle properly positioned, light is emitting by light system 100 through reticle 120 and optical system 200 to strike image sensor 320. This step is referred to as an "exposure" step and corresponds directly with actual exposures directed to target portions of wafer 310 (S430).

Image sensor 320 accurately detects the pattern image produced by exposed reticle 120 (S440), and converts the detected pattern image into corresponding digital data which is then stored in storage device 160 (S450).

Of note, image sensor 320 preferably provides excellent image resolution derived from tens of thousand or millions of pixels. Thus, the images detected by image sensor 320 are very detailed and the resulting image data stored in storage device 160 are well adapted to careful image comparisons. Individual pixels provide within image sensor 320 are defined in relation to their position and position information may be stored in storage device 160 in relation to image data values. That is, for example, an image data storage method may be used which correlates a $10^{th}$ pixel (or a $10^{th}$ pixel in a $20^{th}$ row) with a digital value of "0", an $11^{th}$ pixel with a digital value of "1", and so on.

Comparing section 170 is adapted to continuously (or step-wise) compare the detected image data with previously stored image data (S460). Like the above example, the comparing method may be conducted such that the digital images value associated with a specific pixel for a detected image is compared with the digital data value for the same ordered (e.g., same position) pixel of previously stored image. Through such a method, a comparison between image data for entire pixel arrays (e.g., large fields of data respectively reflecting whole images) may be performed. Alternatively, only selected portions of the respective pixel arrays may be compared.

In addition to being numerically compared on a pixel by pixel basis, one or both of the images being compared may be visually displayed for view by an equipment operator. For example, mismatched overlay portions may be visually highlighted on the display image using conventional image processing software. Such display, allows the equipment operator to quickly address any overlay issues.

Indeed, the comparison of pixel data related to a detected image data and a stored image data may be used in many different ways. For example, in addition to the foregoing use related to an examination of overlay matching between two reticle patterns, comparison results may also be used to check the accuracy of individual patterns associated with a specific reticle.

Figure 5:
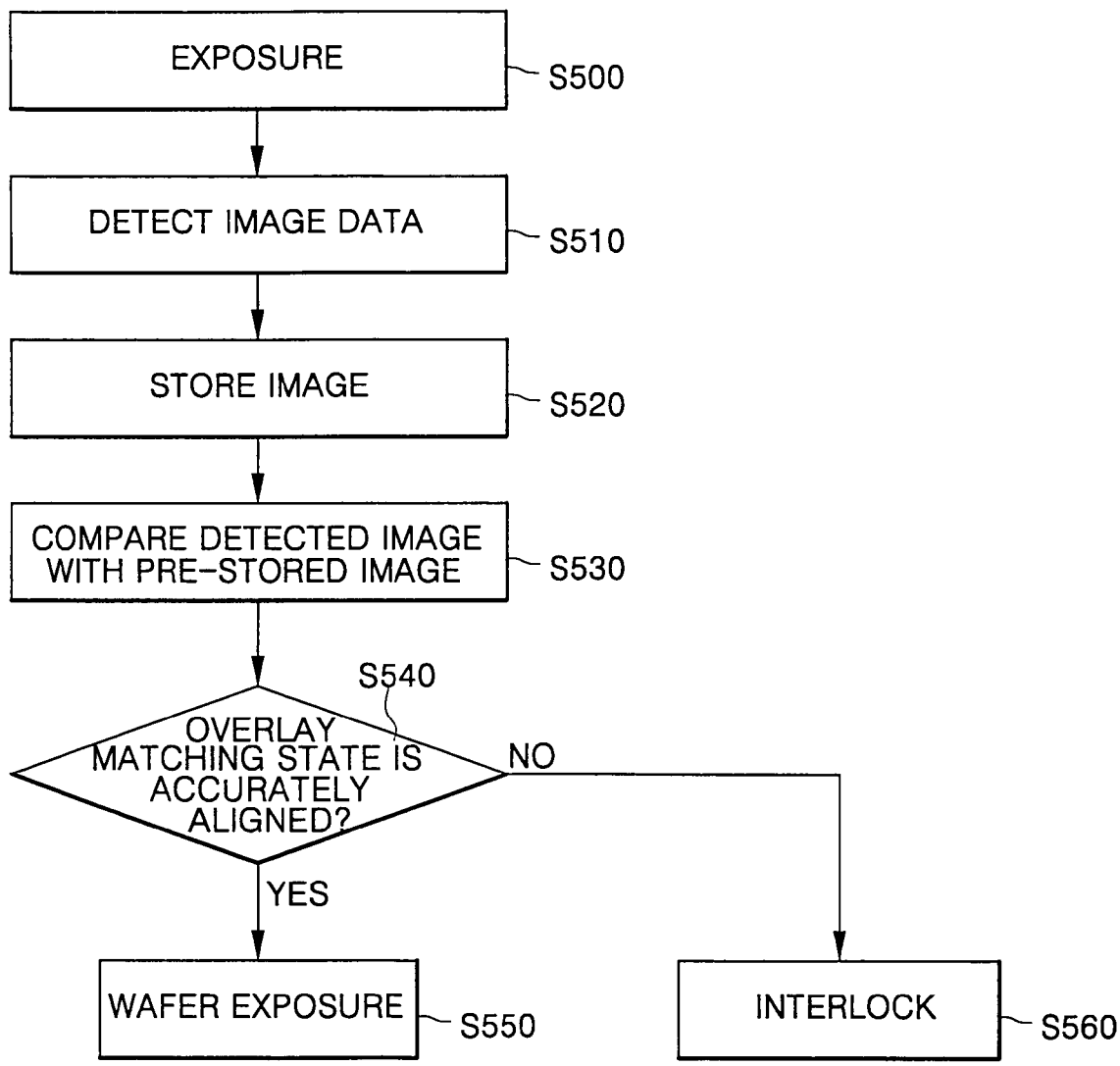
FIG. 5 is a flow chart illustrating an operation for examining a state of the overlay matching of a reticle in an exposure equipment of the present invention.

The application related to an examination of overlay matching state between two reticle patterns will be further described in relation to FIG. 5. The overlay matching is essentially conducted when the multi-layer thin film is formed on the wafer 310.

The process of examining overlay matching state is well adapted for implementation using the exemplary embodiment of exposure equipment described above. In general, image data related to at least two reticles 120 will be examined. Most typically, these reticles correspond to circuit portions overlaying one another in a multi-layer semiconductor structure. Image data for a current reticle is obtained as described above by executing an exposure operation optically directed to image sensor 320 (S500).

Image sensor 320 detects the pattern image produced by the current reticle 120 (S510), and stores the resulting image data in storage device 160 (S520). It is assumed at this point in the process that image data derived from a previously imaged reticle is already stored in storage device 160. Comparing section 170 then reads image data from storage device 160 that corresponds to the two stored pattern images, and compares them using one of any number of conventional image processing techniques (S530).

By comparing image data derived from the two reticle, the overlay matching state (e.g., vertical alignment in the present example) for the corresponding circuits may be accurately determined (S540).

Upon determining an acceptable overlay matching state, the exposure equipment is re-positioned and the wafer is exposed using one or more of the verified reticles (S550). On the contrary, upon determining that the overlay matching state is outside of established tolerances, the control section of the exposure equipment generates an interlock condition (S560). The interlock condition prevents wafer imaging until such time as an equipment operator addressed the overlay issue, replaces one or more defective reticles, as necessary, and to accurately examine the replacement reticles.

The foregoing equipment capabilities and related methods of operation may also be used to compare image data derived from an exposed reticle to previously stored design reference image data in order to verify that the reticle pattern correctly implements the desired circuit pattern design. By use of this method, a process failures related to reticle defects may be minimized if it is conducted before the exposure of a wafer.

Figure 6:
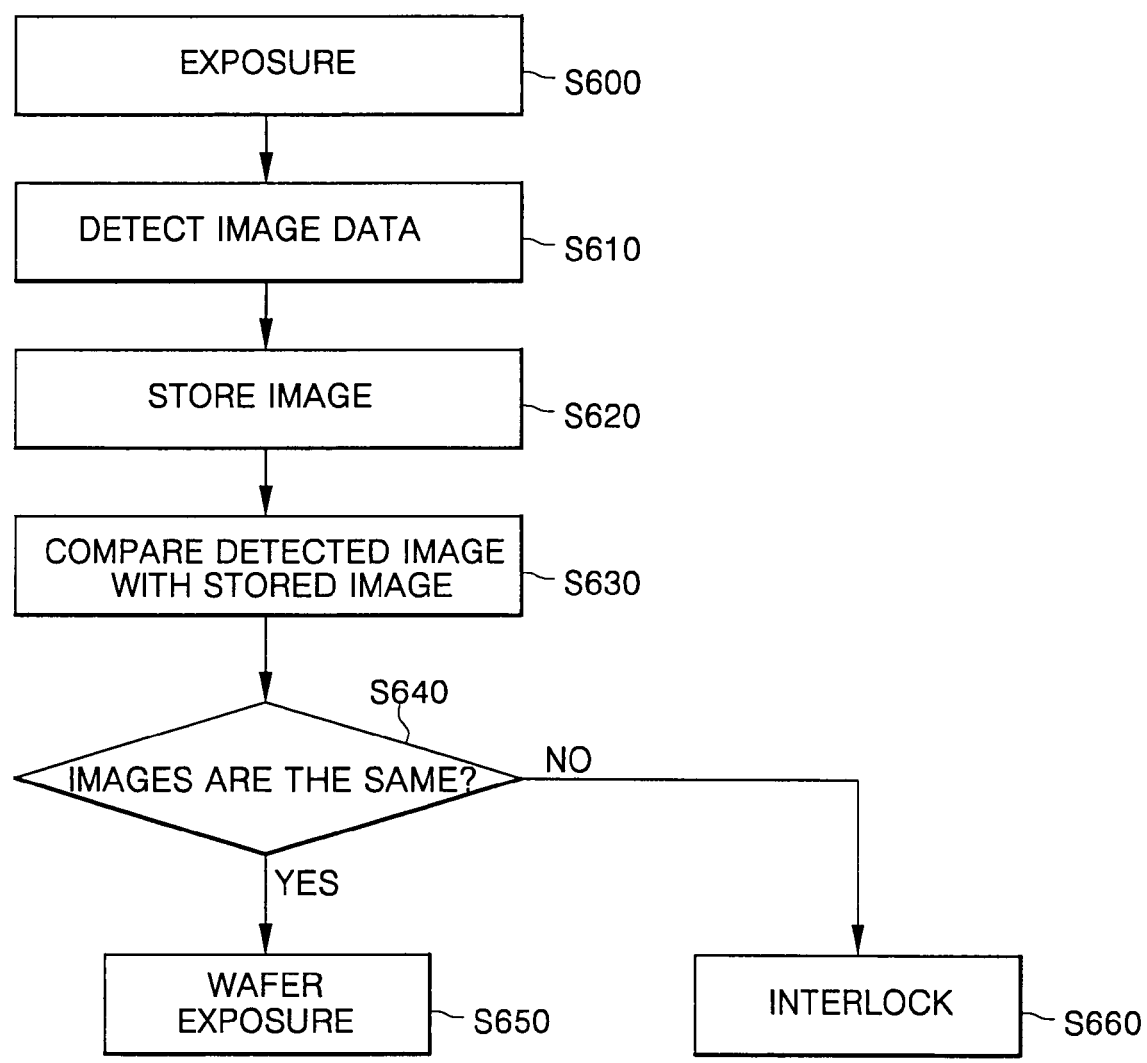
FIG. 6 is a flow chart illustrating an operation for examining the accuracy of a reticle pattern in an exposure equipment of the present invention.

One example of this particular method is illustrated in FIG. 6. It is assumed that design reference (e.g., a design specification or standard) image data has been previously stored in storage device 160.

As before, image data derived from the exposed reticle 120 (S600) is detected by an image sensor 320 (S610) and stored in storage device 160 (S620). Comparing section 170 then compares this image data to the stored design reference image data (S630). On the basis of the comparison results (S640), the exposure equipment either conducts the wafer exposure (S650) or enters an interlock condition (S660). Here again, the interlock condition allows a defective reticle to be corrected or replaced before its use in subsequent wafer exposures.

The term "reference image data" may be used to indicate the stored image data whether it is derived from a design reference or a previously exposed reticle.

From the foregoing, embodiments of the inventive exposure equipment and related methods of operation may be used to prevent reticle-based defects in the manufacture of semiconductor devices. In the described example, an image sensor is associated with wafer stage and an associated optical system to verify detected image data derived from an exposed reticle pattern before use of the reticle in wafer exposure operations. Inter-reticle overlay matching states and reticle pattern conformance with design reference data are just two processes that may be implemented in this regard. The use foregoing verification applications may be efficiently implemented within the exposure equipment and rapidly used in conjunction with conventional wafer exposure operations, thereby increasing operational reliability of the exposure equipment and manufacturing yield for the semiconductor devise being fabricated.

The foregoing embodiments of the invention have, of practical necessity, been drawn to a particular form of exposure equipment. Those of ordinary skill in the art recognize that many different types of exposure equipment exist with many specific form factors. The present invention will find application and may beneficial use within all similar types and forms of exposure equipment. In this context, the term "exposure equipment" should be given its broadest possible interpretation.

What is claimed is:

1. Exposure equipment useful in the manufacture of semiconductor devices, comprising:
    a wafer stage adapted to seat a wafer;
    a light system adapted to provide light having a desired wavelength;
    a reticle adapted to pass the light received from the light system and generate patterned light;
    an optical system positioned between the wafer stage and the reticle and adapted to direct the patterned light;
    an image sensor adapted to detect the patterned light and generate image data corresponding to the patterned light;
    a comparing section adapted to compare the image data with stored reference image data; and
    a control section controlling operation of the comparing section and allowing exposure of the wafer to the pattern light when the image data and the stored reference image data are substantially similar, but generating an interlock condition when the image data and the stored reference image data are not substantially similar, wherein the interlock condition prevents exposure of the wafer to the patterned light.

2. The exposure equipment of claim 1, wherein the wafer stage comprises a holding region adapted to seat the wafer and a detecting region adapted to receive the image sensor.

3. The exposure equipment of claim 2, wherein the wafer stage further comprises a wafer stage transfer unit controlled by the control section and adapted to move the wafer stage so as to selectively expose the holding region and the detecting region to the patterned light.

4. The exposure equipment of claim 1, further comprising:
    a storage device controlled by the control section and adapted to store image data and reference image data, wherein the comparing section receives both image data and reference image data from the storage device.

5. The exposure equipment of claim 4, wherein the reference image data comprises image data related to a previously exposed reticle or image data related to a design reference.

6. The exposure equipment of claim 1, wherein comparison of the image data and reference image data indicate a state of overlay mismatch between two or more reticles.

7. The exposure equipment of claim 1, wherein the image sensor comprises a CMOS image sensor or a CCD image sensor.

8. A method of controlling exposure equipment during the manufacture of a semiconductor device, the method comprising:

emitting light having a desired wavelength and passing the light through a reticle and an optical system to expose either a wafer seated on a wafer stage or an image sensor to patterned light generated by the reticle;

detecting the patterned light with the image sensor;

comparing image data generated by the image sensor in response to the detected patterned light with reference image data stored in a storage device, and if the image data and reference data are substantially similar, then exposing the wafer to the patterned light, else entering an interlock condition that precludes exposure of the wafer to the patterned light.

9. The method of claim 8, wherein the reference image data comprises image data related to a previously exposed reticle or image data related to a design reference.

10. The method of claim 9, wherein the comparison of the image data and reference image data indicates a state of overlay mismatch between the reticle and the previously exposed reticle.

11. The method of claim 9, wherein the comparison of the image data and reference image data verifies the accuracy of a pattern formed on the reticle in relation to a design reference associated with the pattern.

12. The method of claim 8, wherein the wafer stage comprises a holding region adapted to seat the wafer and a detecting region holding the image sensor.

13. The method of claim 12, wherein the wafer stage further comprises a wafer stage transfer unit adapted to move the wafer stage so as to selectively expose the holding region or the detecting region to the patterned light.

14. The method of claim 8, further comprising:

storing the image data and the reference image data in a storage device; and, selectively transferring image data or reference image data from the storage device to a comparing section in order to compare the image data with the reference data.

15. The method of claim 8, wherein the image sensor comprises a CMOS image sensor or a COD image sensor.

16. A method of controlling exposure equipment during the manufacture of a semiconductor device, the method comprising:

emitting light having a desired wavelength and passing the light through a reticle and an optical system to expose either a wafer seated on a wafer stage or an image sensor to patterned light generated by the reticle;

detecting the patterned light with the image sensor;

comparing image data generated by the image sensor in response to the detected patterned light with reference image data stored in a storage device, wherein the reference image data comprises image data related to a previously exposed reticle or image data related to a design reference, and wherein the comparison of the image data and reference image data indicates a state of overlay mismatch between the reticle and the previously exposed reticle; and upon determining that the image data and reference image data are substantially similar, exposing the wafer to the pattern light, but upon determining that the compared image data and reference image data are not substantially similar, entering an interlock condition.

17. A method of controlling exposure equipment during the manufacture of a semiconductor device, the method comprising:

emitting light having a desired wavelength and passing the light through a reticle and an optical system to expose either a wafer seated on a wafer stage or an image sensor to patterned light generated by the reticle;

detecting the patterned light with the image sensor;

comparing image data generated by the image sensor in response to the detected patterned light with reference image data stored in a storage device, wherein the comparison of the image data and reference image data verifies the accuracy of a pattern formed on the reticle in relation to a design reference associated with the pattern; and upon determining that the compared image data and reference image data are substantially similar exposing the wafer to the pattern light, or upon determining that the compared image data and reference image data are not substantially similar entering an interlock condition.

* * * * *